(12) United States Patent
Schadt

(10) Patent No.: US 6,404,226 B1
(45) Date of Patent: Jun. 11, 2002

(54) INTEGRATED CIRCUIT WITH STANDARD CELL LOGIC AND SPARE GATES

(75) Inventor: John Anthony Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/400,029

(22) Filed: Sep. 21, 1999

(51) Int. Cl.[7] .................. H03K 19/177; H01L 27/10
(52) U.S. Cl. .................... 326/41; 326/39; 326/101; 326/47; 257/209; 257/203; 257/210; 257/211
(58) Field of Search .................. 326/10, 39–41, 326/101; 365/200; 257/202, 204, 209, 210, 259

(56) References Cited

U.S. PATENT DOCUMENTS

| | | | | |
|---|---|---|---|---|
| 5,313,119 A | * | 5/1994 | Cooke et al. | 307/465.1 |
| 5,416,740 A | * | 5/1995 | Fujita et al. | 365/200 |
| 5,459,342 A | * | 10/1995 | Nogami et al. | 257/209 |
| 5,696,943 A | * | 12/1997 | Lee | 395/500 |
| 5,777,887 A | * | 7/1998 | Marple et al. | 364/489 |
| 5,892,249 A | * | 4/1999 | Courtright et al. | 257/209 |
| 5,959,905 A | * | 9/1999 | Payne | 365/200 |
| 6,222,211 B1 | * | 4/2001 | Chen | 257/206 |

* cited by examiner

Primary Examiner—Michael Tokar
Assistant Examiner—Vibol Tan

(57) ABSTRACT

An integrated circuit comprises an array of standard cell logic having spare gate logic dispersed therein. The spare gate logic is connectable to the standard cell logic through upper level conductors. This allows the design of an integrated circuit to be changed by changing the pattern of the upper level conductors, thereby lowering the cost of making a design change and reducing the disturbance of the original wiring. In an illustrative embodiment, the top two or three metal levels and associated vias are mask-programmable for this purpose. The interconnections from the mask-programmable upper levels to the underlying standard cell logic is accomplished using a regular array of conductor vias interspersed throughout the standard cell array, plus elevated output terminal which create a loop structure completed by the program levels. This allows output terminal loops of the standard cells to be brought up to the mask-programmable metal levels for removal of any standard cell logic. The spare gate logic comprises a relatively small percentage of logic gates as compared to the standard cell logic (typically less than 20 percent). This allows for the economies of production usually associated with conventional standard-cell ASIC arrays, while providing for economical and rapid repair of logic errors and/or the implementation of changes in logic functionality, by requiring changes in only the top metal levels.

29 Claims, 5 Drawing Sheets

INTEGRATED CIRCUIT WITH STANDARD CELL LOGIC AND SPARE GATES

BACKGROUND OF THE INVENTION

1. Field of the Invention

The present invention relates to an integrated circuit having a standard cell array that programmably includes spare logic gates.

2. Description of the Related Art

The cost of making an integrated circuit (IC) is related to the number and lithography size of processing steps: necessary for forming the desired circuit pattern, including active devices (e.g., transistors) and associated interconnections. These steps include those necessary for obtaining a substrate, typically a semiconductor, and forming multiple dopant diffusions, insulating regions, and conductive patterns in and on the substrate. These forming steps include multiple lithography steps, wherein the size, shape, and location of the various features are defined. In present-day commercial integrated circuit production, a minimum lithography linewidth of 0.25 micrometers ("microns") is typically employed, with a reduction to 0.18 microns likely in the near future, and subsequent reductions in due course thereafter. This advanced processing technology allows for the production of very complex integrated circuits often employing over a million transistors, and even greater than 10 million transistors in many cases. The functions that may be implemented thereby are also often very complex.

The process of designing an integrated circuit must not only implement the desired circuit functionality (i.e., circuit synthesis), but must also translate that functionality into the precise location and geometry of the above-noted features on the integrated circuit (i.e., layout). Unfortunately, the very great complexity in the synthesis and layout of an integrated circuit usually results in a number of design errors that must be corrected before the IC functions satisfactorily. This is true even though the actual number of errors may be relatively small, being typically only a few logic gates out of several thousand or more. That is, the error rate is often significantly less than 20 percent of the total number of gates on the IC, and typically about 5 percent, and yet the errors must be corrected. To correct these mistakes, it is often necessary to construct an entirely new set of lithographic masks that are used to define the above-noted features. In typical IC production processes, a mask set usually comprises at least twelve masks, and frequently twenty or more, at a cost of over 100 thousand dollars per mask set. One common form of integrated circuit is an "Application Specific Integrated Circuit" (ASIC), that implements a desired function,using an array of "standard cells. Standard cell design is commonly implemented by a set: of standard functions or physical cells that taken as a group are called a library. The individual cells within the library implement discrete gate-level function; for example, NAND, NOR, XOR, ADD, invert, multiplex, register, latch, driver, etc.

Standard cell layout is distinguished by custom transistor layout, so that a change to a physical cell location or type requires all mask levels to be changed, with the attendant costs. Physically, standard cell layout places individual cells into cell rows, with cells typically (but not necessarily) all being the same height. The rows may be separated by wiring channels in which signal conductors are placed. Alternatively, the rows may be abutted in which case the wiring channels are omitted. Standard cell designs, often referred to as Application Specific Integrated Circuits (ASICs) typically offer the IC industry the best combination of various factors, including a relatively short design interval, productivity, cost, die size, power and performance. However, a significant drawback is the time and cost required to make changes to the logic circuitry after the IC is initially designed. In addition, it is very difficult to exhaustively test ASIC designs of the above-noted complexity before mask order. It is known in the ASIC art to include extra standard cells in a row that are not fully connected in the initial design, but are available for making minor changes in subsequent mask revisions. However, that prior-art technique requires programming all the metal levels in order to include the extra cells in the functional circuitry. Consequently, a need exists to be able to introduce minor design changes into an ASIC after the initial design without requiring a redesign of all the mask levels.

Furthermore, the prior-art technique may exact a performance penalty if a needed cell type is far from the needed location. That is, the specific cells available and their locations are commonly not optimal for the design change required. This is due to the uncontrolled spare gate placement resulting from netlist-based methods of the cell placement engine. That is because netlist-based standard cell spare gates are placed by the cell placement engine in the place-and-route tool, resulting in pseudo-random placement of spare gates. Another commonly encountered drawback is that specific design changes, for example adding a 32-bit shift register to the design, exceed the capacity of the spare gates local to the region of interest. In addition, the fixed spare gates may be of an unsuitable gate type.

In the art of circuit board design, it is known to make small changes to system functionality by tacking on individual wires and gates to patch a design as needed. This may be referred to as the "white wire" approach to circuit modifications. However, this utilizes the ability to solder individual wires to the circuit board, and in any direction necessary. In other words, various portions of the circuit may be accessed after the initial design, which capability is not available in integrated circuits. Therefore, in the case of integrated circuits, other techniques have been adopted to change circuit functionality. For example, various forms of programmable logic are known in the art. One form is the "field programmable gate array" (FPGA), in which various logic configurations may be selected in a board-mounted integrated circuit by the use of software-controlled logic gates and routing conductors; see, for example U. S. Pat. No. 5,384,497 co-assigned herewith. In another variation, electrically blown-fuses are used for programming the FPGA in the field; i.e., after manufacture. However, in return for the flexibility of programming, FPGAs tends to be slower than the ASIC equivalent. In addition, FPGAs are not as dense, typically one-tenth the density of ASICs or less, so they are more costly.

Another form of programmable logic is the gate array, which use a fixed pattern of transistors upon which logic cells. are programmed by means of custom layout of the metal conductor levels. A change in a gate array typically requires changing all of the metal mask levels. Since gate arrays rebuild all of the wiring, the design interval required to make a change in the logic is lengthy and costly. For example, in a 6-level metal technology the time interval for a gate array redesign is typically over one-half that of a standard cell redesign. Furthermore, the density of a gate is array is only about one-half that of a standard cell design. The speed of the gates in a gate array is similar to those in an ASIC, but the overall logic speed, is usually about 10 to 20 percent slower due to less efficient signal routes. Still another type of programmable device employs a laser-configurable or single-mask configurable gate array that is useful for prototyping, and which may be densified into a fixed compact design for volume production; see U.S. Pat. No. 95,565,758.

Some attempts have been made to mix technologies at the functional block level, with a block typically comprising over 1,000 gates. All the gates in a given functional block are of a given technology (e.g,., standard cell or gate array). The strategy is to implement the less defined and hence less stable logic in the more configurable technologies, and to implement the stable logic in standard cells. The result is a combination of discrete functional blocks implemented in several technology forms. However, the block-based technology mixes impose a requirement to separate the logic into different technology-based blocks with relatively long wiring between blocks. This adds extra effort to the design itself and compromises performance due to the long interblock wires. In addition, these prior-art designs do not provide for reprogrammability to alter the standard-cell portions of the logic, often the major portion of the IC's logic, while providing for economical volume production.

SUMMARY OF THE INVENTION

I have invented an integrated circuit comprising an array of standard cell logic having included therein spare gate logic. The spare gates are connectable to at least some of the standard cells in the array through an array of vias that elevate lower level conductors up to an intermediate conductor level. The logic of an integrated circuit design may then be changed by changing the pattern of the upper level conductors.

DETAILED DESCRIPTION

Figure 1:
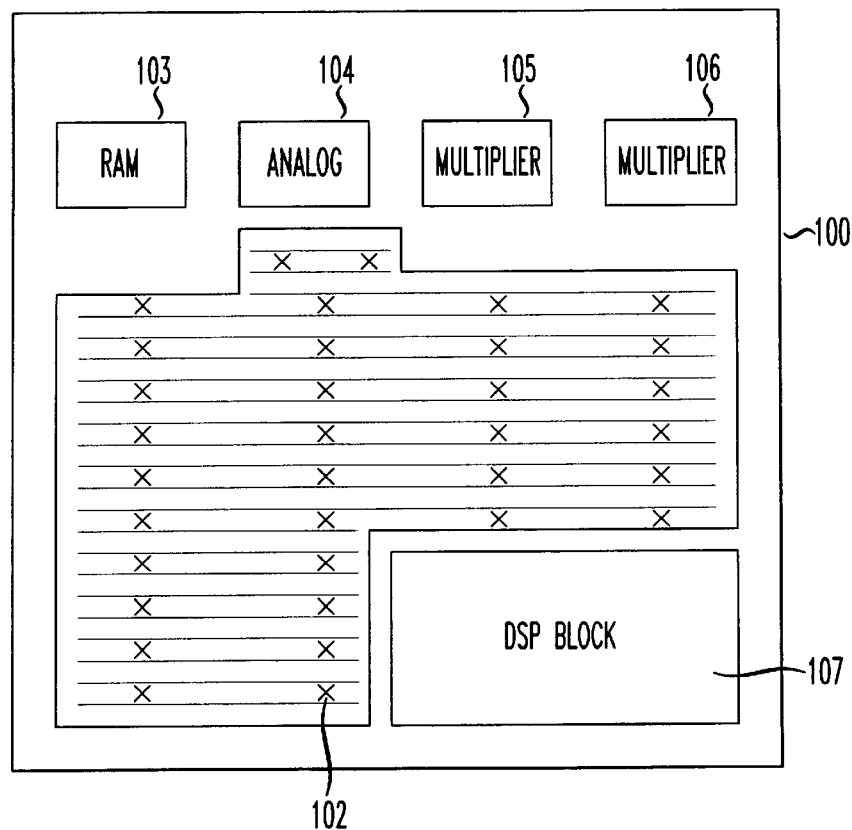
FIG. 1 illustrates an integrated circuit having a standard cell array with spare gate clusters.

The following detailed description relates to an integrated circuit (IC) and programming technique that allows for changing the logic of the IC by changing the upper metal levels. An aspect of the technique is to distribute spare gates into a standard cell logic array in a manner predetermined by the floor plan of the physical level. The spare gates are typically clusters that are symmetrically dispersed throughout the array in the illustrative embodiment, so that changes may be made with equal ease in all parts of the array. However, unsymmetrical dispersal is possible, so that more spare gates may be located in vicinities more likely to require change. While separated spare gate clusters are more fully illustrated herein, the spare gates may occupy rows of cells, either partial or full rows. The spare gates may typically access any of the standard cells in any part of the standard cell array, although access to less than all the standard cells in the array is also useful in many cases.

In the present technique, the spare logic is unconnected to the standard cell array in the initial design of the integrated circuit. Subsequent minor design changes, involving typically in the range of 10 to 100 gates per change, may then be implemented by inserting the programmable logic into the design by the above-noted mask programming of the conductor levels. Typically, the topmost 2 or 3 conductor levels are used for programming, but more may be used if desired. In the illustrative embodiment, the programming is accomplished using the upper two levels of metal and the windows to the next metal level down from each of the two metal levels, which may be referred to as 2 level programming. Further reference will be made to also using the next-lower conductor level, which may be referred to as 2½level programming; that is, programming three metal levels and two via levels. The gates added by this technique amount to typically less than 20 percent of the gates in the array. The spare gate logic is most typically of the programmable gate variety similar to that used in a conventional gate array, wherein the spare gate logic itself may be programmed by changing the conductor levels. However, it is alternatively possible to use standard cells as the spare gate logic.

For the purposes of discussion, a five level metal technology will be assumed, with "metal 1" being the lowest metal level (i.e., nearest the semiconductor substrate) and "metal 5" being the top metal level. However, the present invention may be applied to technologies with either more or fewer interconnect levels. Furthermore, non-metal conductors may be used for interconnects, most typically for the lower levels that provide local interconnects. These conductor types may include doped polysilicon, metal silicide, titanium nitride, and other types.

"Access terminals", are placed on the original standard cell wiring, and serve to elevate the lower-level standard cell wiring up to the intermediate "interface" conductor level. They make possible the attachment of spare gate logic to the existing standard cell wiring in the array. "Elevated spare gate I/O terminals" allow the spare gate inputs and outputs to be brought up to the interface level, making possible the insertion of spare gate logic in place of, or in addition to, the original standard cells. "Insertion loops" are the standard cell I/O terminals elevated to the lowermost programming conductor level. The present technique thereby allows the standard cell wiring to be both accessed and removed through modification of only the "upper" conductor levels; that is, those above the lowest conductor level, which is fixed in the initial design. The result is lower mask set costs when making modifications to the original design, and various other advantages.

In a first illustrative embodiment, the metal 4 and 5 levels plus the window between metal 3 and 4 will be used for minor logic changes. Multiple logic changes are possible and the concept could be expanded to support larger changes if desired.

Referring to FIG. 1, an integrated circuit (IC) 100 includes a standard cell logic array 101 that comprises spare gate clusters illustratively marked as "X" (e.g., 102) embedded within the core logic. The core logic comprises standard cells that may be arranged in rows separated by wiring channels according to techniques known in the art. One form of standard cell array is shown, for example, in U. S. Pat. No. 4,319,396 co-assigned herewith, with others being possible. The convention used herein is that the preferred direction for the metal 3, and 5 conductors is horizontally; that is, they run parallel to the standard cell rows. The metal 2 and 4 conductors then preferentially run vertically to the rows. However, this preferred orientation may be reversed and the present technique may still be applied. The IC may include circuitry other than the standard cell array, illustratively a memory array 103, analog circuitry 104, multipliers 105, 106 and a custom block implementing a digital signal processor 107. The type of arrangement illustrated, wherein a single standard cell array fills the area between the other blocks, is referred to as a standard cell with a flat layout style. However, the standard cell area may itself be subdivided into blocks, referred to as a "block based" standard cell layout, and each block considered an array for purposes of the present technique.

Figure 2:
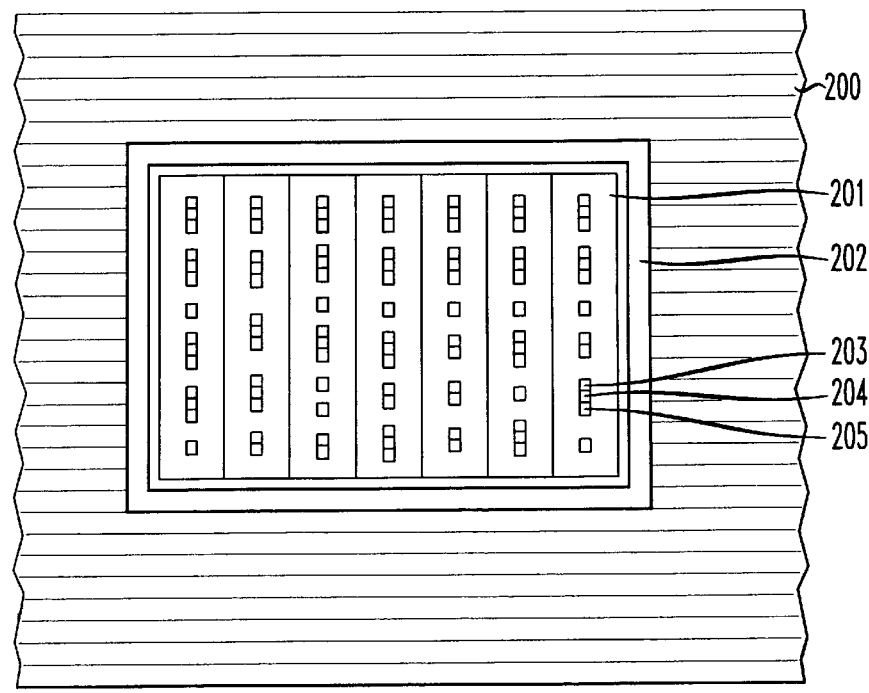
FIG. 2 illustrates a spare gate cluster located in a standard cell array.

Referring to FIG. 2, an illustrative portion of a standard cell core 200 having a single spare gate cluster 201 is shown. The spare gate cluster is illustratively bounded by power supply bus conductors 202, which is an underlaid ring structure as illustrated, with Vdd overlying Vss (or vice-versa). Alternatively, concentric rings using straps and jumpers to distribute power to the cell rows may be used. The spare gate cluster provides input/output (I/O) terminals that are elevated to an intermediate conductor level, illustratively metal level 3; for example, 203 is an output terminal and 204 and 205 are input terminals. The terminals are aligned on one track per row in the illustrative case, in order to minimize routing blockage on the metal 2 level.

Figure 3:
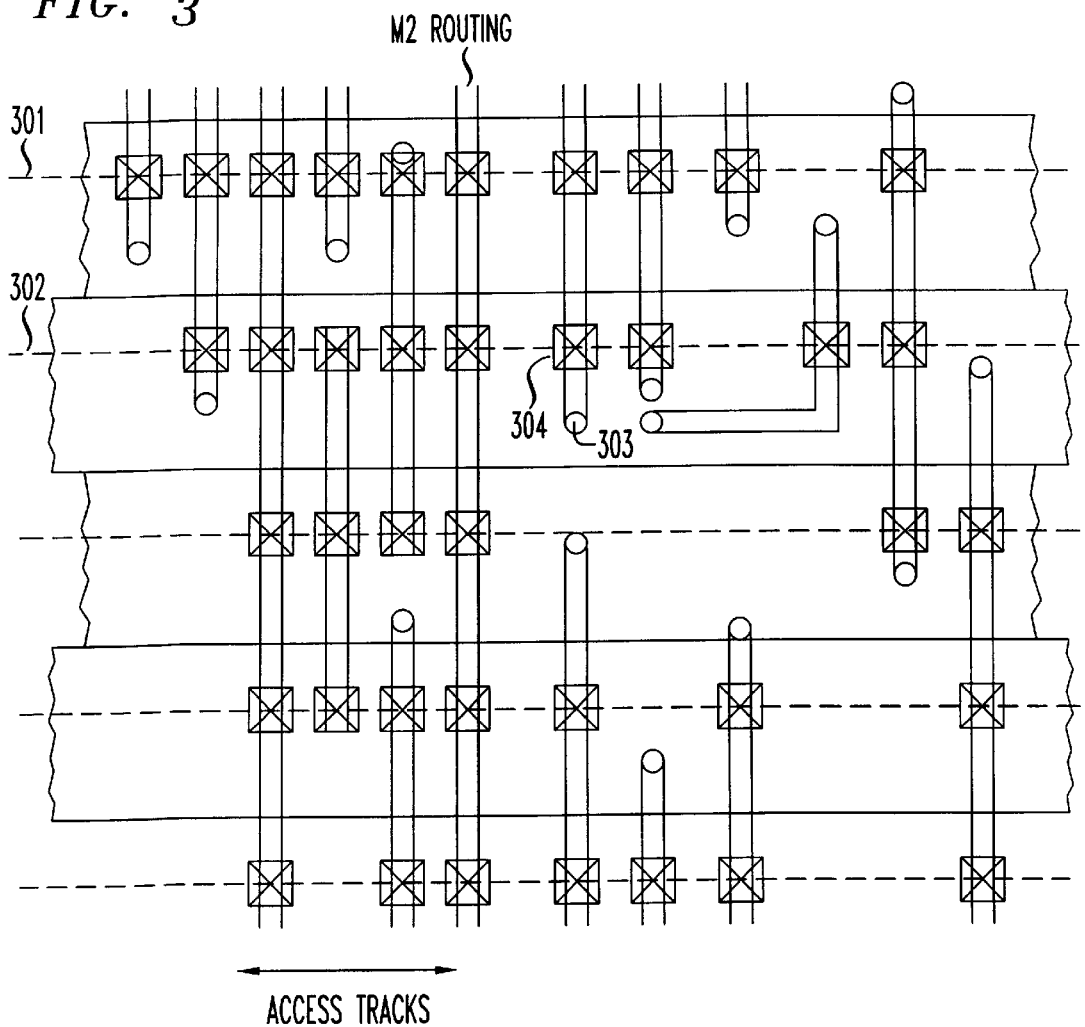
FIG. 3 illustrates four rows of standard cells having access tracks for access to underlying conductor levels.

Referring to FIG. 3, an illustrative representation of four rows of standard cells is shown. In the illustrative embodiment, the cell rows are assumed to run horizontally. The vertical conductor routing is done on metal 2 and 4 while the horizontal routing is done on metal 3 and 5. Global wiring is performed on metal 2, 3, 4, and 5, with no global conductors placed on metal 1 for this example. The "access tracks" are conductor tracks reserved by the place-and-route computer aided design (CAD) tool, where vias from the metal 3 level down to the metal 2 level are located at fixed (i.e., non programmable) intervals. The access tracks may be arranged one per row, but could be some other ratio if desired. That is, one access track per row usually allows for full connectivity of the spare gates to all gates of the standard cell array, whereas fewer tracks allow for partial connectivity. In the illustrative embodiment, one metal 3 track is allocated per standard cell row for the purpose of attaching metal 3 contact heads to all of the metal 2 runners. Two such metal 3 tracks are indicated as 301 and 302. An I/O terminal that is part of the original design is shown as 303, whereas an access terminal that allows contact to the upper conductor levels for subsequent design changes is shown as 304. Metal 3 is thereby established as an interface level to all underlying routes and cell terminals. Since the interface level is above the lowest conductor level but below the uppermost conductor levels, it is also referred to as the "intermediate" level herein. This construction means that the programming levels, in this case metal 4 and 5 and the window between levels 3 and 4 can now access or touch any inter-cell wire in the design.

Providing access to the standard cell wiring includes: 1) opening of access tracks on a global and regular manner through the core, and 2) the placement of access terminals on the intermediate conductor level, in this case metal 3, which allows lower-level connectivity to be elevated to the intermediate level. In addition to metal 2 global tracks, it could also pertain to the metal 1 terminals of spare gates which would be elevated through a via ("pushed up") so as to contact the metal 3 interface level. A significant aspect is that these features are placed on underlying wiring levels, illustratively levels 1 and 2, which are normally fixed (i.e., not mask programmable), allowing them to be more easily accessed and modified later in the production process. It can be seen that a number of the access terminals in the access tracks may be left unconnected even after alterations are made in the chip design by changes to the upper conductor levels. If desired, the intermediate conductor level may itself be otherwise unprogrammed; that is, not changed as a result of revisions to the IC design. However, it is frequently advantageous to make use of the intermediate conductor level for programming purposes also. Therefore, in a second embodiment of the invention, the metal 3 level conductors may be changed, for example, to minimize congestion in the upper conductor levels that is produced by input and/or output loops. This will be further illustrated by the discussion of insertion loops below.

Figure 4:
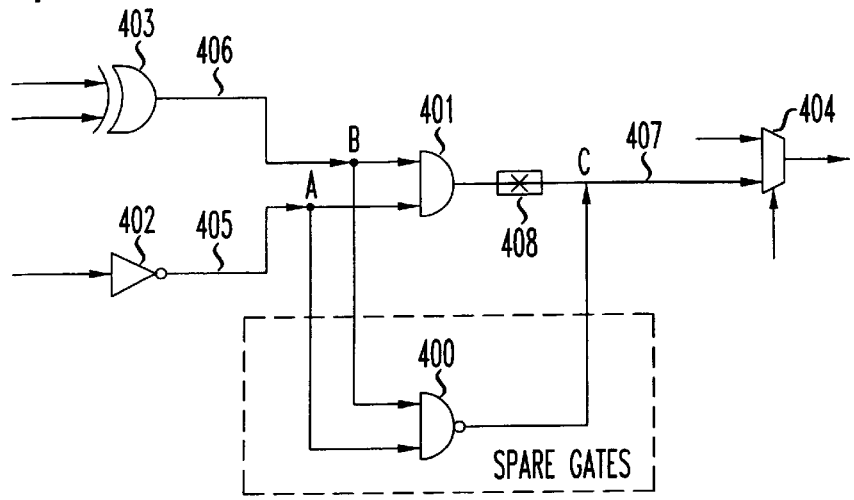
FIG. 4 illustrates spare gate logic substituting for standard cell logic.

Another aspect of the illustrative embodiment of the invention relates to the output terminals of the standard cell gates being elevated through at least one set of vias to at least the lower-most programming level, being metal 3 or 4 in the illustrative cases, before contacting any downstream cells. This permits the substitution of a standard cell gate by a spare gate by means of the programming levels. Since the cell outputs are connected to cell inputs in the standard cell array by the lower-most programming level, changes to this level can be used to disconnect any gate. This is illustrated in FIG. 4, wherein a spare NAND gate (400) in the spare gate logic portion of the array is substituted for the AND gate (401) in the standard cell array. This is accomplished by connecting the inputs of the NAND gate 400 to the inputs of the AND gate 401. Note that these inputs remain connected to the outputs of inverter 402 and exclusive OR gate 403 (lines 405 and 406, respectively), since these outputs may drive both input loads simultaneously. However, the output of AND gate 401 is disconnected at 408 from line 407, which is an input to the multiplexer 404. Therefore, the output of the NAND gate 400 may drive line 407 without contention from the output of AND gate 401. Thus, an insertion of spare gate logic to replace the original standard cell logic has been accomplished. This substitution may be readily accomplished using a mask change to the programming metal levels (e.g. levels 4 and 5) and associated vias down to intermediate level 3, since all of the outputs are brought up to those levels as noted above. This saves all mask levels up to metal 3 or metal 4, which represents approximately 75 percent of the mask costs in the illustrative case.

It can be seen that various other substitution of logic circuitry may be similarly accomplished using the inventive technique. A disconnect of the output of a gate in the standard cell array is not necessary in all cases. For example, when it is desired to augment the drive capabilities of a gate, both the original gate and the spare gate outputs may be connected together. Note that by modifying the standard cell wiring scheme with access tracks and cell output loops, the resultant standard cell wiring becomes accessible and configurable from the upper conductor levels.

Figure 5:
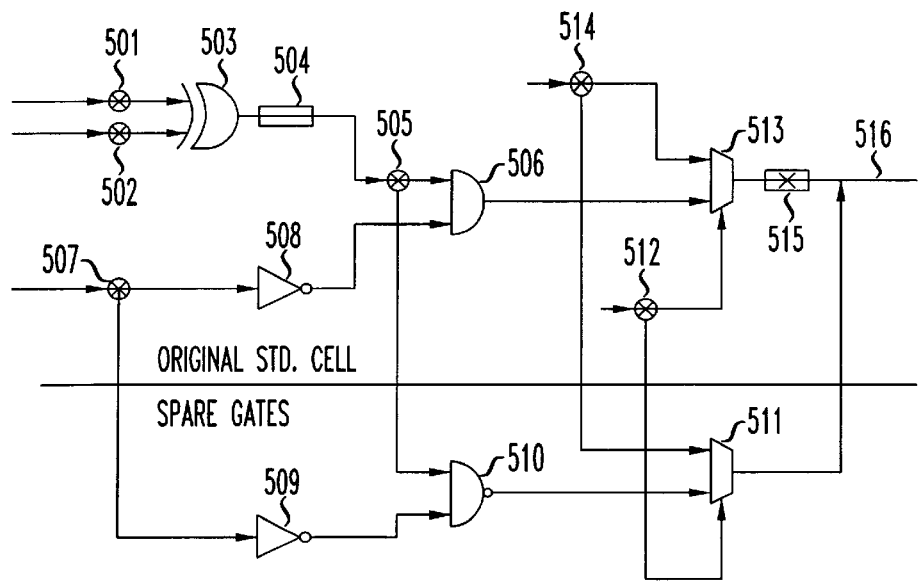
FIG. 5 illustrates spare gate logic substitution with partial connectivity.

As noted above, partial connectivity implies that not all of the standard cell array may be accessed by a given spare gate. Therefore, when partial connectivity to the standard cells is present, logic changes are accomplished by substituting larger cell groups, as illustrated in FIG. 5. This technique replicates some of the original standard cell logic until all wires of interest become available. The original standard cell logic comprises gates 503, 506, 508 and multiplexer 513. To accomplish the substitution, gates 509 and 510 are substituted by connecting their inputs at access terminals 507 and 505 to the inputs of gates 508 and 506. Furthermore, the select line for multiplexer 511 is connected to the select line of multiplexer 513 at access terminal 512, and the upper input of multiplexer 511 is connected to the upper input of multiplexer 513 at access terminal 514. The output of multiplexer 513 is disconnected from the output line 516 by breaking the insertion loop 515. Also, the output of multiplexer 511 is connected to the output line by a change in the programmable level to connect 516 to the elevated spare gate I/O terminal for the output of 511. Note, that in this modification, the access terminals 501 and 502 are left unconnected to the spare gate circuitry, and the insertion loop 504 remains unmodified. It can be seen that partial connectivity may be useful in a variety of circumstances where full connectivity is not feasible or desired.

Figure 6:
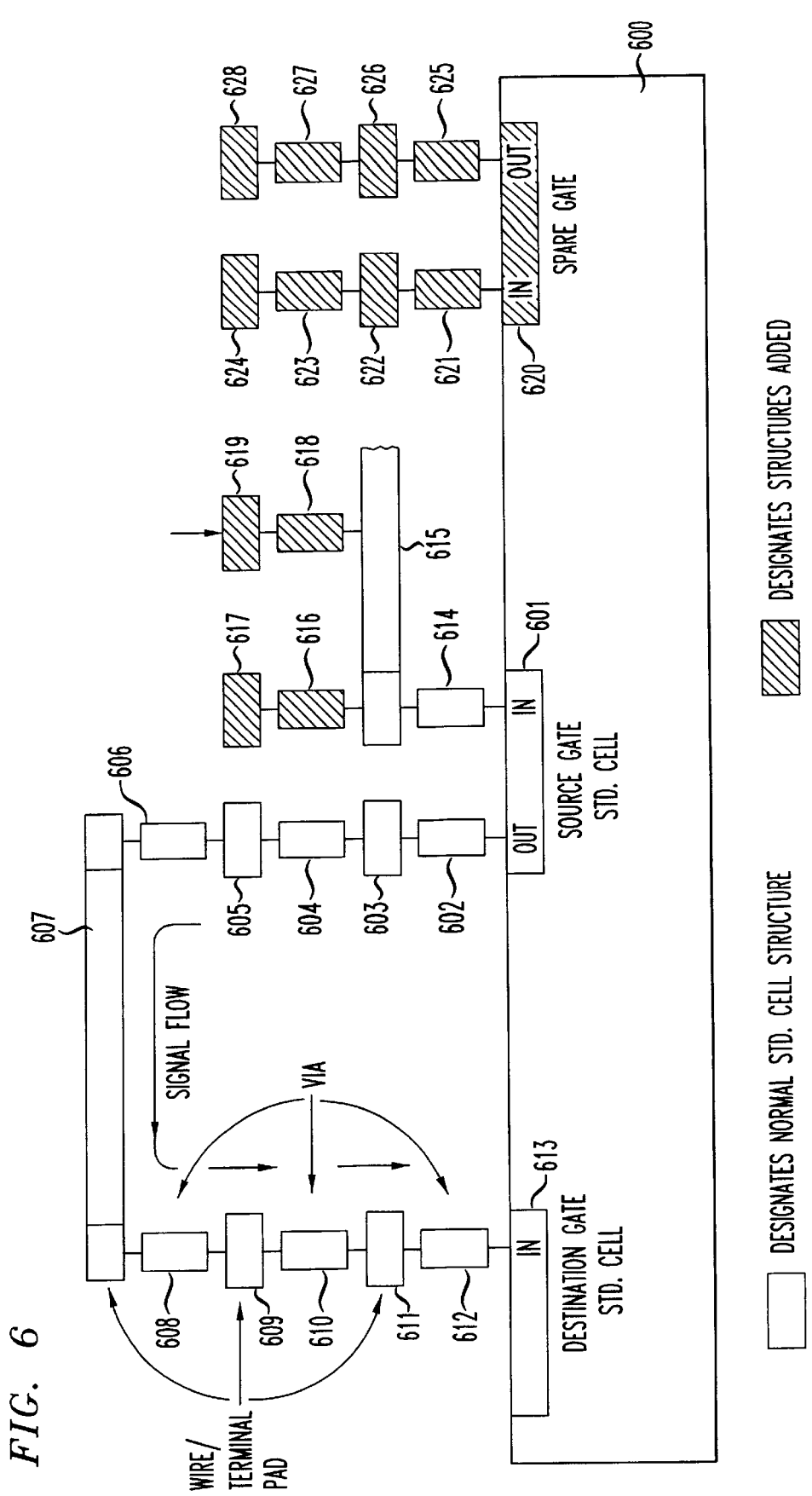
FIG. 6 illustrates an integrated circuit cross-section having conductor levels in an initial design.

Referring to FIG. 6, an illustrative IC cross-section shows the various conductor levels above the semiconductor substrate 600 in an initial design. That is, the design in the standard cell array has not been altered by reprogramming the upper conductor levels to access the spare gates. The interlevel dielectric levels, typically silicon dioxide, doped glass, or other materials known in the art are not shown for clarity. A "source gate" 601 in the standard cell array comprises an output terminal which is elevated through via 602 to landing pad 603 in the metal 2 level, and up through via 604 to landing pad 605 in the metal 3 level, and finally up through via 606 to the runner 607 in the metal 4 level. The runner 607 then supplies the output down through via 608 to landing pad 609 in the metal 3 level, down through via 610 to landing pad 611 in the metal 2 level, and finally down through via 612 to the input of the "destination cell" 613 in the standard cell array. The input of the source gate 601 is supplied through via 614 from the conductor 615 in the metal 2 level from another source cell (not shown).

All of the structure of FIG. 6 described thus far 5 may be considered normal for standard cell conductors. However, additional structure, shown crosshatched, is provided for access to the spare gate 620. This includes an additional via 616 that elevates the input runner 615 up to landing pad 617 in the metal 3 level, and additional via 618 that elevates the input runner 615 up to the landing pad 619 in the metal 2 level. Note that the vias and landing pads 615–619 comprise access terminal that are placed at regular intervals on the metal 2 runners (e.g. 615). It can be seen that the access terminals are not used in the original design, and are provided for the purpose of implementing spare gate changes. The spare gate 620 is provided with I/O terminals that are elevated to the metal 3 intermediate level, through vias and landing pads 621–628, as shown. The metal level 5 may also interface with the metal 3 access tracks by the further use of still other vias (not shown) between the metal 5 and metal 4 levels. Note that vias 616, 618 up to the access terminal 617 and 619 are placed at regular intervals in the initial design of the standard cell array, and so the lithographic mask that accomplishes the placement of these vias need not be changed when making wiring modifications. Similarly, the vias up to the access terminal 624 and 628 associated with the spare gate 620 are included in the initial design, and need not be changed for subsequent programming.

The intermediate conductor level, being metal 3 in the illustrative embodiment, provides access tracks that are not present in prior-art layout techniques. That is, the vias from metal 2 up to metal 3 are placed at defined locations regardless of the initially programmed layout of the upper conductor levels. For example, access terminal 617, 619 and associated vias 616, 618 provide access from the programmable upper level conductors down to the metal 2 runner 615. The access vias and elevated I/O terminals are not normally present in a standard cell design. Note that adding vias and elevated terminals requires design effort, reduces wiring capacity at the intermediate (e.g., metal 3) level, and adds wiring blockages. However, it adds the capability to implement spare gate substitutions as taught herein.

From the above discussion, it can be seen that the present technique uses various structures that are not present in prior-art designs:

(1) Access terminals are placed on the original standard cell wiring, and serve to elevate the lower level standard cell; wiring up to the intermediate conductor level.

(2) Elevated spare gate I/O terminals are placed on the input and output terminals of the spare gates, and serve to elevate these terminals to the intermediate conductor level. Note that they serve no function in the original design, and are used only to make subsequent modifications by providing signal connectivity to the spare gates.

(3) Insertion loops, which may be either input loops or output loops, are the standard cell I/O terminals elevated to the lowermost programming conductor level. They provide functional connectivity in the original design, but in addition provide the ability to break the connection and insert spare gates into the original design.

Note that in prior art designs, many cell outputs would normally complete their wiring with metal 2 and lower levels. Some of the outputs would be elevated to metal 4 or metal 5 due to wiring congestion. However, with the inventive technique, all the inputs and/or outputs of the cells in the standard cell array which are to be made accessible for repair will be elevated to at least the lowermost program level (metal 3 or metal 4 in the illustrative cases).

Figure 7:
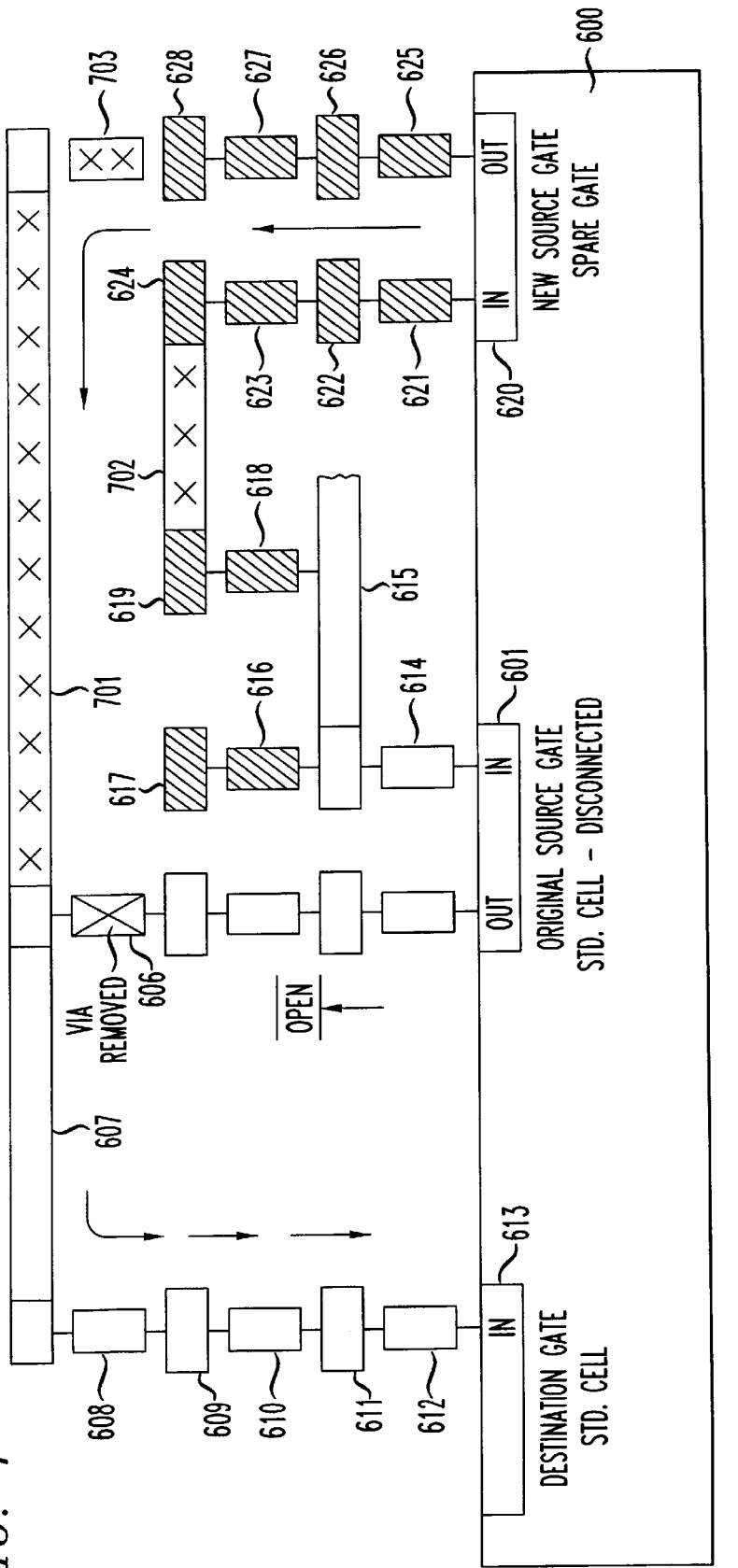
FIG. 7 illustrates the integrated circuit of FIG. 6 having modified conductor levels that have been programmed to implement a design change.

Referring to FIG. 7, the conductor structure is shown after making a modification to the original design, wherein an insertion loop is illustrated for substituting the spare gate 620 for the original source gate 601. In order to connect the spare cell into the array at the desired point, the runner 701 in the metal 4 level is provided from via 703 to the original runner 607 in the metal 4 conductor. This connects the output of the spare gate 620 to the input of the destination gate 613 in the standard cell array. In addition, the via 606 is removed, thereby preventing the original source gate 601 from driving the destination gate 613. Furthermore, the runner 702 is added in the metal 3 level from the access terminal (i.e., landing pad) 619 to the access terminal 624, thereby connecting the input of the original source cell to the input of the spare gate cell. In most cases, the input from the source (not shown) on conductor 615 does not need to be disconnected from the original source gate 601, since the inputs normally provide a high impedance load that allows more than one input to be driven at a time.

The conductors 701 and 702, as well as the via 703 are defined during the reprogramming of the IC after the initial design is completed, in order to affect the desired change for repair or modification purposes. It is also apparent that rather than connecting the output of the spare gate by means of a metal 4 conductor 701 as illustrated, the spare gate connection could be pushed up still further, to a metal 5 conductor for example. Alternatively, the spare cell connection could be accomplished using the intermediate level, metal 3 in the illustrative case, without being elevated further. The intermediate level in that case then serves both the functions of providing access terminals and also programmable routing. The actual connection level chosen often depends on the primary direction of routing (horizontal or vertical as defined above), or to ease routing congestion, or to obtain a desired signal delay, or various other factors.

Note that the above concepts related to the access ports and the program level output loops are not present in prior-art standard cell wiring. Their purpose is for allowing reprogramming the logic by upper level mask changes, as for fixing bugs or making alterations to the logic for other purposes. Therefore, the standard cell wiring may for the most part retain the look and feel of the usual standard cell wiring topologies. That is, it will typically not resemble the fixed wiring arrays associated with FPGA style logic or mask configurable gate array logic. However, it is typically desirable in implementing the invention to "open up" the routing in the top-most conductor level in the original design, in order to allow for subsequent wiring changes. This may be accomplished with typical place-and-route design software by increasing the "cost function" associated with the top conductor level. Then, the computer-aided design tool will tend to place more of the conductors in the original design on the levels below the top-most level, and fewer on the top level.

Another aspect of the invention is the recognition that with full or partial access and disconnect control of the standard cell logic, it is now possible to combine standard cell logic with other forms of logic. This allows for creating different levels of programming and change capability; in effect, creating new forms of logic. In the prior art, it is possible to add a block of FPGA logic to an ASIC and wire it into a standard cell design. The problem is that such prior-art combinations require all of the metal masks to be re-generated to change any of the standard cell wiring or the interface wiring between the two forms of logic. It also typically requires long interface wire, which may decrease performance. This greatly limits the usefulness of the combination. By using concepts 1 and 2 discussed above, configurable logic blocks may be combined with standard cell. Then, only the programming levels would need to be regenerated in order to rewire the standard cell-to-spare gate interface. This results in a significant cost and time savings, and limits the variability of the conductor lengths required to make the change.

Alternatively or additionally, the inventive technique may be used to wire in extra spare gates that were distributed within the core logic of the original design. Thus, the wiring scheme supports mixing of standard cell logic with other forms of logic in either a block based or low level, proximate distributed manner. The net effect or result is to create a new form of logic array: mask programmable standard cell. Mask programmable refers to the need of re-generating only a small subset of levels, the programming levels, and not the full set of masks to implement changes. Standard cell refers to the fact that the logic is mainly standard cell and shares the vital characteristics of high performance, high density, low power, that make standard cell logic so attractive. Hence, the coupling of this standard cell wiring scheme to another form of logic, whether it be gate array, hard spare gates, FPGA, Laser Programmable, or some other form of logic, produces a combination logic form which previously did not exist.

Figure 8:
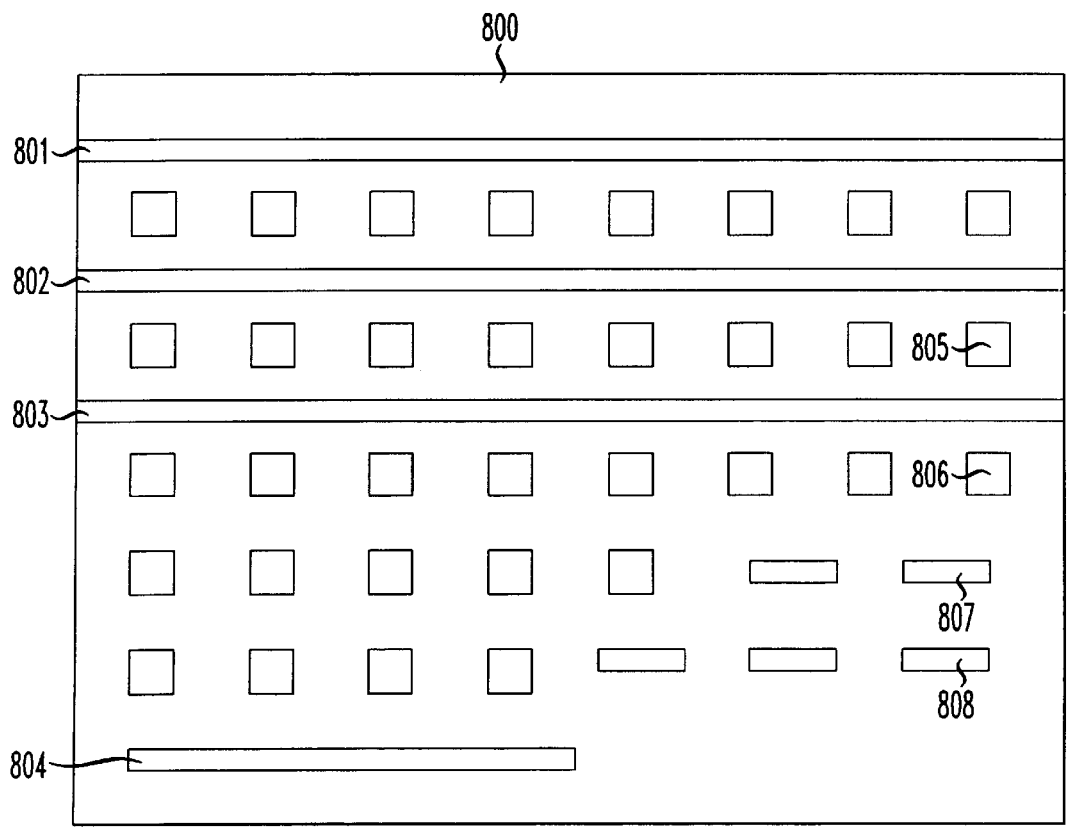
FIG. 8 illustrates different geometries of interspersed spare gates, including dispersed clusters, as well as full and partial rows.

While the use of dispersed clusters of spare gates are illustrated above, the spare gates may be located in rows that extend fully or alternatively only partially across the standard cell array. For example, FIG. 8 illustrates a standard cell array 800 having full rows 801, 802 and 803 of spare gates, and partial row 804. Clusters of spare gates may also be included, if desired. The clusters may be square, as 805 and 806, or rectangular, as 807 and 808, with still other variations being possible. As used herein, a group of spare gates is considered to be a "cluster" when it has an aspect ratio of 3-to-1 or less, and more typically 2-to-1 or less. A cluster has less than 1000 spare gates, and more typically less than 200 spare gates, and is optionally bounded by a power bus ring as described above. All such configurations are considered to be interspersed spare gates as used herein.

The above-described method permits full access and modification to the standard cell wiring through means of the two upper metal levels plus the window down to the next metal level. These levels constitute the programming levels while the next metal level down becomes the lower signal levels. The benefit is that changing relatively few, top-level masks will enable significant spare gate change capability to standard cell designs cutting both time and cost out of the prototype interval, and improving the reliability of the change as compared, to various prior-art techniques. By gaining access to the standard cell wiring through just the upper levels and windows, the wiring of standard cell ICs can be much more easily modified as bugs are uncovered. Still other benefits will be apparent in particular applications to persons of skill in the art.

I claim:

1. An integrated circuit comprising an array of standard cells having spare gates interspersed therein, wherein the spare gates are connectable to at least some of the standard cells in the array through at least one set of vias in a fixed array of spare gate vias that elevate fixed lower level spare gate conductors up to an intermediate conductor level that programmably connects to mask-programmable upper level conductors, one or more of the standard cells having conductors that are also elevated through at least one set of vias in a fixed array of standard cell vias to at least the intermediate conductor level, the spare gates thereby being programmably connectable to one or more of the standard cells using conductors of the intermediate conductor level in association with one or more of the mask-programmable upper level conductors.

2. The integrated circuit of claim 1 wherein the spare gates are of a type selected from the group consisting of programmable gates and standard cells.

3. The integrated circuit of claim 1 wherein said mask-programmable upper level conductors comprise two upper-most metal conductor levels of said integrated circuit and associated vias.

4. The integrated circuit of claim 3 wherein said intermediate conductor level is also programmable.

5. The integrated circuit of claim 1 wherein said intermediate conductor level is a third metal conductor level, and said upper level conductors comprise fourth-level and fifth-level metal conductors.

6. The integrated circuit of claim 1 wherein the number of said spare gates is less than 20 percent of the number of gates in said standard cell array.

7. The integrated circuit of claim 1 wherein said spare gates are located in clusters dispersed in said array.

8. The integrated circuit of claim 1 wherein said spare gates are located in rows across said array.

9. The integrated circuit of claim 1 wherein said spare gates are located in rows that are orthogonal to the direction of the rows in which said standard cells are located.

10. The integrated circuit of claim 1 wherein said spare gates are located in rows that are parallel to the direction of the rows in which said standard cells are located.

11. An integrated circuit comprising an array of standard cells having spare gates interspersed therein, wherein the spare agates have input and output terminals that are elevated through at least one set of vias in a fixed array of spare gate vias to at least an intermediate conductor level that is above the lowest conductor level used to implement said standard cells, one or more of the standard cells having input and output terminals that are also elevated through at least one set of vias in a fixed array of standard cell vias to at least the intermediate conductor level, the spare gates thereby being programmably connectable to one or more of the standard cells using conductors of the intermediate conductor level in association with one or more mask-programmable upper level conductors.

12. The integrated circuit of claim 11 wherein the spare gates are of a type selected from the group consisting of programmable gates and standard cells.

13. The integrated circuit of claim 11 wherein said mask-programmable upper level conductors comprise two upper-most metal conductor levels of said integrated circuit and associated vias.

14. The integrated circuit of claim 13 wherein said intermediate conductor level is also programmable.

15. The integrated circuit of claim 11 wherein the number of said spare gates is less than 20 percent of the number of gates in said standard cell array.

16. The integrated circuit of claim 11 wherein said spare gates are located in clusters dispersed in said array.

17. The integrated circuit of claim 11 wherein said spare gates are located in continuous rows across said array.

18. The integrated circuit of claim 11 wherein said spare gates are located in rows that are orthogonal to the direction of the rows in which said standard cells are located.

19. The integrated circuit of claim 11 wherein said spare gates are located in rows that are parallel to the direction of the rows in which said standard cells are located.

20. A method of making an integrated circuit comprising an array of standard cells having spare gates interspersed therein, by steps comprising connecting at least some of the spare gates to at least some of the standard cells in the array through at least one set of vias in a fixed array of spare gate vias that elevate fixed lower level spare gate conductors up to an intermediate conductor level that programmably connects to mask-programmable upper level conductors, one or more of the standard cells having conductors that are also elevated through at least one set of vias in a fixed array of standard cell vias to at least the intermediate conductor level, the spare gates thereby being programmably connectable to one or more of the standard cells using conductors of the intermediate conductor level in association with one or more of the mask-programmable upper level conductors.

21. The method of claim 20 wherein the spare gates are of a type selected from the group consisting of programmable gates and standard cells.

22. The method of claim 20 wherein said mask-programmable upper level conductors comprise two upper-most metal conductor levels of said integrated circuit and associated vias.

23. The method of claim 20 wherein said intermediate conductor level is also programmable.

24. The method of claim 20 wherein said intermediate conductor level is a third metal conductor level, and said upper level conductors comprise fourth-level and fifth-level metal conductors.

25. The method of claim 20 wherein the number of said spare gates is less than 20 percent of the number of gates in said standard cell array.

26. The integrated circuit of claim 20 wherein said spare gates are located in clusters dispersed in said array.

27. The integrated circuit of claim 20 wherein said spare gates are located in continuous rows across said array.

28. The integrated circuit of claim 20 wherein said spare gates are located in rows that are orthogonal to the direction of the rows in which said standard cells are located.

29. The integrated circuit of claim 20 wherein said spare gates are located in rows that are parallel to the direction of the rows in which said standard cells are located.

* * * * *

UNITED STATES PATENT AND TRADEMARK OFFICE
CERTIFICATE OF CORRECTION

PATENT NO.      : 6,404,226 B1
DATED           : June 11, 2002
INVENTOR(S)     : Schadt It is certified that error appears in the above-identified patent and that said Letters Patent is hereby corrected as shown below:

<u>Column 11,</u>
Line 6, "spare agates" should be -- spare gates --.

Signed and Sealed this

Twenty-eighth Day of January, 2003

JAMES E. ROGAN
*Director of the United States Patent and Trademark Office*